(12) United States Patent
Lai

(10) Patent No.: US 6,660,655 B2
(45) Date of Patent: Dec. 9, 2003

(54) METHOD AND SOLUTION FOR PREPARING SEM SAMPLES FOR LOW-K MATERIALS

(75) Inventor: Jane-Bai Lai, Hsin-Chu (TW)

(73) Assignee: Taiwan Semiconductor Manufacturing Company, Hsin-Chu (TW)

(*) Notice: Subject to any disclaimer, the term of this patent is extended or adjusted under 35 U.S.C. 154(b) by 0 days.

(21) Appl. No.: 10/389,786

(22) Filed: Mar. 17, 2003

(65) Prior Publication Data

US 2003/0157802 A1 Aug. 21, 2003

Related U.S. Application Data

(62) Division of application No. 09/414,927, filed on Oct. 12, 1999.

(51) Int. Cl.[7] .................................... H01L 21/302
(52) U.S. Cl. ............................................. 438/745
(58) Field of Search ........................ 438/745; 216/63

(56) References Cited

U.S. PATENT DOCUMENTS

| | | | | |
|---|---|---|---|---|
| 3,976,524 A | * | 8/1976 | Feng | 156/8 |
| 4,443,933 A | * | 4/1984 | de Brebisson | 29/578 |
| 4,733,074 A | | 3/1988 | Kato et al. | 250/307 |
| 5,352,898 A | | 10/1994 | Mehta | 250/443.1 |
| 5,726,454 A | | 3/1998 | Chun | 250/442.11 |
| 5,891,768 A | * | 4/1999 | Figura et al. | 438/253 |
| 6,139,915 A | * | 10/2000 | Martini | 427/352 |
| 6,387,819 B1 | * | 5/2002 | Yu | 438/725 |

OTHER PUBLICATIONS

Albrecht, "Materials Issues with Thin Film Hydrogen Silses–quioxane Low K Dielectrics," J. Electrochem. Soc., vol. 145, No. 11, Nov. 1998, pp. 4019–4024.
Peters, "Pursuing the Perfect Low–k Dielectric," Semiconductor Int.'l, Sep. 1998, pp. 64–74.

* cited by examiner

Primary Examiner—Nadine G. Norton
Assistant Examiner—Lynette T. Umez-Eronini
(74) Attorney, Agent, or Firm—George O. Saile; Stephen B. Ackerman

(57) ABSTRACT

A method and a solution for preparing SEM samples comprising low-K dielectric materials. The process begins by providing a SEM sample comprising low-K dielectric material and silicon oxide material. A solution is formed for preparing (staining and etching) the SEM sample by adding $NH_4F$ (s) to a solution comprising $CH_3COOH$ having a concentration of about 98% at a ratio of about 1 g $NH_4F$ (s):20 ml $CH_3COOH$, then stirring until the $NH_4F$ (s) is thoroughly dissolved. Alternatively, the $NH_4F$ (s) can be added to a solution comprising $HNO_3$ having a concentration of about 70% and $CH_3COOH$ having a concentration of about 98%, with a volume ratio of about 15 ml $HNO_3$:20 ml $CH_3COOH$. The $NH_4F$ (s) is added at a ratio of about 1 g $NH_4F$ (s):35 ml $CH_3COOH$ and $HNO_3$, and stirred until the $NH_4F$ (s) is thoroughly dissolved. The SEM sample is then etched in this solution for about 3 seconds, whereby the low-K dielectric material and silicon oxide material have similar etch rates with good selectivity to metals.

12 Claims, 1 Drawing Sheet

METHOD AND SOLUTION FOR PREPARING SEM SAMPLES FOR LOW-K MATERIALS

This is a division of patent application Ser. No. 09/414,927, filing date Oct. 12, 1999, Method And Solution For Preparing Sem Samples For Low-K Materials, assigned to the same assignee as the present invention.

BACKGROUND OF INVENTION

1) Field of the Invention

This invention relates generally to semiconductor fabrication and more particularly to a method and chemical solution for preparing SEM samples comprising low-K dielectric materials.

2) Description of the Prior Art

For advanced generation semiconductors (0.18 microns and beyond), RC delay (resistance×capacitance) begins to dominate overall device delay. Copper lines and low-K dielectric materials are attractive for reducing RC delay, and thereby enhancing performance. Chemical vapor deposited fluorinated oxide (FSG), hydrogen silsesquioxane (HSG), and methylsilsesquioxane (MSQ) spin-on materials are particularly attractive low-K dielectric materials for sub-quarter micron applications that are sensitive to RC delay, such as inter-level dielectric (ILD) layers.

However, due to different material characteristics, the etch rate for spin-on low-K materials is typically faster than the etch rate for traditional silicon oxide ($SiO_x$), making it difficult to prepare SEM samples.

The importance of overcoming the various deficiencies noted above is evidenced by the extensive technological development directed to the subject, as documented by the relevant patent and technical literature. The closest and apparently more relevant technical developments in the patent literature can be gleaned by considering the following patents.

U.S. Pat. No. 4,733,074 (Kato et al.) shows a SEM sample surface structure having an insulating layer over the substrate.

U.S. Pat. No. 5,726,454 (Chun) shows a tripod for preparing a SEM sample.

U.S. Pat. No. 5,352,898 (Mehta) shows a method and apparatus for preparing slurry specimens for SEM.

Also, further relevant technical developments can be gleaned by considering the following articles.
Peters, "Pursuing the Perfect Low-K Dielectric," Semiconductor International, September 1998, pp. 64–74, discusses low-K dielectrics, including HSG.
Albrecht, "Material Issues with Thin Film Hydrogen Silsesquioxane Low-K Dielectrics, J. Electrochem. Soc. Vol. 145, No. 11, November 1998, pp. 4019–4024, discusses chemical composition of HSG and its effect on dielectric constant and thermal stability.

SUMMARY OF THE INVENTION

It is an object of the present invention to provide a method and chemical solution for preparing SEM samples comprising low-K spin-on dielectric materials.

It is another object of the present invention to provide a method and chemical solution for staining SEM samples which provides a decreased difference in etch rates of low-K spin-on dielectric materials and convention silicon oxides. It is yet another object of the present invention to provide a method for preparing a chemical solution for staining SEM samples which provides a decreased difference in etch rates of low-K spin-on dielectric materials and convention silicon oxides.

To accomplish the above objectives, the present invention provides a method and a solution for preparing SEM samples comprising low-K dielectric materials. The process begins by providing a SEM sample comprising low-K dielectric material and silicon oxide material. A solution is formed for preparing (staining and etching) the SEM sample by adding $NH_4F$ (s) to a solution comprising $CH_3COOH$ having a concentration of about 90% at a ratio of about 1 g $NH_4F$ (s):20 ml $CH_3COOH$, then stirring until the $NH_4F$ (s) is thoroughly dissolved. Alternatively, the $NH_4F$ (s) can be added to a solution comprising $HNO_3$ having a concentration of about 70% and $CH_3COOH$ having a concentration of about 90%, with a volume ratio of about 15 ml $HNO_3$:20 ml $CH_3COOH$. The $NH_4F$ (s) is added at a ratio of about 1 g $NH_4F$ (s):35 ml $CH_3COOH$ and $HNO_3$, and stirred until the $NH_4F$ (s) is thoroughly dissolved. The SEM sample is then etched in this solution for about 3 seconds.

The present invention provides considerable improvement over the prior art. Most importantly, SEM samples comprising low-K dielectric materials and silicon oxides can be prepared wherein the low-K dielectric material and silicon oxide material have similar etch rates with good selectivity to metals.

The present invention achieves these benefits in the context of known process technology. However, a further understanding of the nature and advantages of the present invention may be realized by reference to the latter portions of the specification and attached drawings.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which.

DETAILED DESCRIPTION OF THE INVENTION

The present invention will be described in detail with reference to the accompanying drawings. The present invention provides a method and a solution for preparing SEM samples with low-K dielectric materials (e.g. HSG and MSG) and silicon oxide materials wherein the low-K dielectric materials and silicon oxide materials have similar etch rates and selectivity to metal.
Problem Identified by the Inventors—FIGS. 1 & 2

Figure 1:
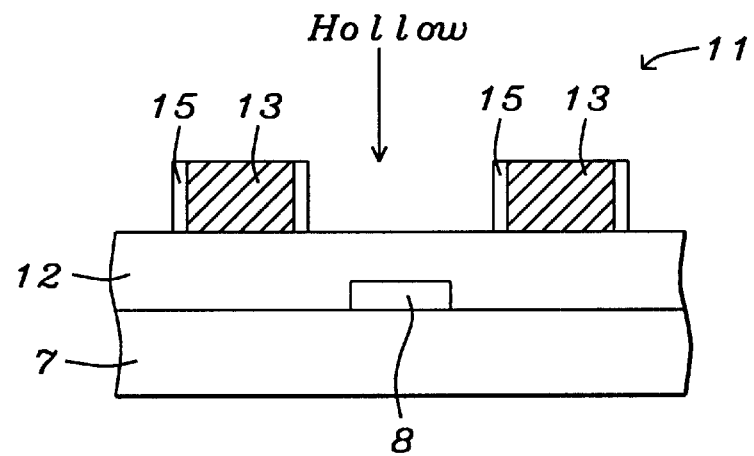
FIG. 1 illustrates a SEM sample comprising a low-K spin-on dielectric material and a silicon oxide material having a first problem identified by the inventor; wherein the low-K spin-on dielectric material is completely removed.

FIG. 1 illustrates a process determined by the inventor to have a first problem, wherein a SEM sample (11) comprising a low-K spin-on dielectric material (not shown), a metal structure (13), aliner oxide (15), and a dielectric layer (e.g. ILD, IMD) (12) composed of silicon oxide is prepared (stained and etched) using a solution comprising 10 ml 50% HF, 200 ml 98% $CH_3COOH$, and 200 ml 70% $HNO_3$. In FIG. 1 the SEM sample is a cross section of a gate (8) on a semiconductor structure (7). The metal structure (13) is one of a plurality of conductive plugs which are separated by a low-K dielectric material (not shown). The first problem identified by the inventor is that the slope solution etches the low-K spin-on dielectric material too fast (i.e. too high a selectivity of the low-K spin-on dielectric material relative to the oxide liner (15) and dielectric layer (12)), removing excess amounts of the low-K spin-on dielectric material as shown in FIG. 1.

Figure 2:
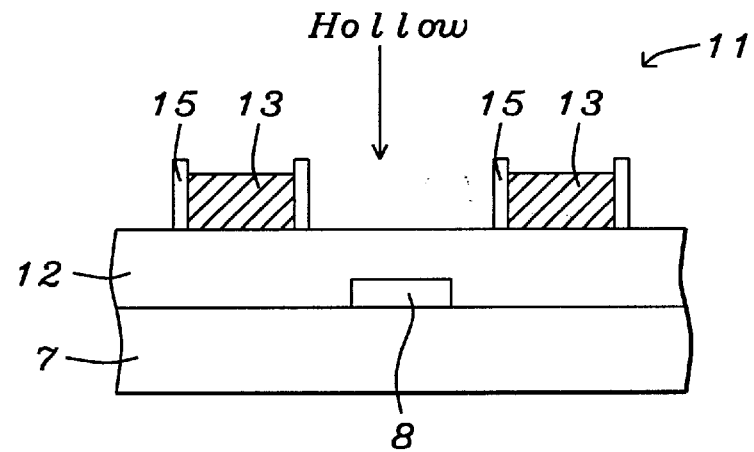
FIG. 2 illustrates a SEM sample comprising a low-K spin-on dielectric material and a silicon oxide material having a second problem identified by the inventor, wherein adjacent metal structures are etched.

FIG. 2 illustrates a process determined by the inventor to have a second problem, wherein a SEM sample (11) comprising a low-K spin-on dielectric material (not shown), a dielectric layer (12) composed of silicon oxide, a liner oxide (15), and a metal structure (13) is prepared (stained and etched) using a 200:1 buffered oxide etch (BOE) solution. The second problem identified by the inventor is that the BOE solution does not provide adequate etch selectivity of the dielectrics relative to the metal structure, resulting in undesirable metal removal as shown in FIG. 2. If the metal structure (13) does not remain the same after the stain (i.e. the metal structure can not be etched by the stain process), then the X-SEM will not provide the desired information.
Preferred Embodiment of the Present Invention—FIG. 3

The preferred embodiment of the present invention begins by providing a SEM sample (11), such as a semiconductor structure having thereon a low-K spin-on dielectric material (14), a dielectric layer (12) preferably composed of silicon oxide, a liner oxide (15), and a metal structure (13). The low-K spin-on dielectric material preferably has a composition with silicon-hydrogen (Si—H) bonds, such as hydrogen silsesquioxane (HSQ) or methylsilsesquioxane (MSQ).

Figure 3:
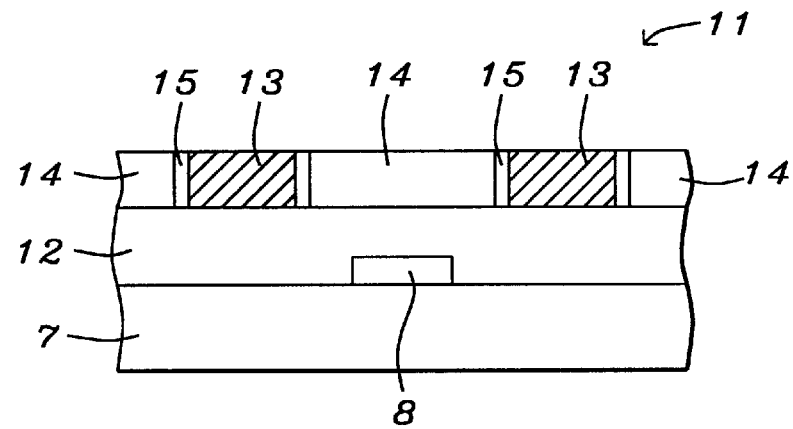
FIG. 3 illustrates a SEM sample prepared according to the present invention.

The SEM sample (11) is then prepared (stained and etched) using a novel solution formed by dissolving $NH_4F$ (s) in a solution comprising $CH_3COOH$ at a concentration of between about 90% and 100%, preferably about 98%. The SEM sample (11) is preferably etched using this solution for a time of between about 1 second and 5 seconds, preferably about 3 seconds. A key advantage of the present invention is that the etch rate for low-K dielectric materials containing silicon-hydrogen bonds using the present invention is slower than the etch rate using traditional silicon oxide etching solutions, while the selectivity to metals is maintained. The result is a SEM sample (11) as shown in FIG. 3 wherein the similar etch rates for the dielectric layer (12) composed of silicon oxide, a liner oxide, and the low-K dielectric layer (14) provide a relatively planer cross-section, without metal loss due to poor selectivity to metal.

The solution for preparing SEM samples according to the present invention can be prepared by adding $NH_4F$ (s) in a solution comprising $CH_3COOH$ having a concentration of between about 90% and 100%, preferably about 98%, at a ratio of between about 0.5 g $NH_4F$ (s):20 ml $CH_3COOH$ and 2 g $NH_4F$ (s):20 ml $CH_3COOH$ and $HNO_3$, preferably about 1 g $NH_4F$ (s):20 ml $CH_3COOH$. The solution is stirred until the $NH_4F$ (s) is thoroughly dissolved.

Alternatively, the solution for preparing SEM samples according to the present invention can be prepared by adding $HNO_3$ having a concentration of between about 50% and 96%, preferably 70% to $CH_3COOH$ having a concentration of between about 90% and 100%, preferably 98%. The volume ratio is between about 10 ml $HNO_3$:30 ml $CH_3COOH$ and 20 ml $HNO_3$:10 ml $CH_3COOH$, preferably 15 ml $HNO_3$:20 ml $CH_3COOH$. Then, $NH_4F$ (s) is added to the solution comprising $HNO_3$ and $CH_3COOH$. The ratio of $NH_4F$ (s) added to the solution comprising $HNO_3$ and $CH_3COOH$ is between about 0.5 g $NH_4F$ (s):35 ml $CH_3COOH$ and $HNO_3$ and 2 g $NH_4F$ (s):35 ml $CH_3COOH$ and $HNO_3$. The solution is stirred until the $NH_4F$ (s) is thoroughly dissolved.

While the invention has been particularly shown and described with reference to the preferred embodiments thereof, it will be understood by those skilled in the art that various changes in form and details may be made without departing from the spirit and scope of the invention.

What is claimed is:

1. A method for preparing SEM samples comprising low-K dielectric materials, comprising the steps of:
   a. providing a SEM sample comprising low-K dielectric material and silicon oxide material; and
   b. etching said SEM sample in a solution comprising $NH_4F$ (s) dissolved in a solution comprising $HNO_3$ having a concentration of between about 50% and 96% and $CH_3COOH$ having a concentration of between about 90% and 100% at a volume ratio of between about 10 ml $HNO_3$:30 ml $CH_3COOH$ and 20 ml $HNO_3$:10 ml $CH_3COOH$; said $NH_4F$ (s) being added at a ratio of between about 0.5 g $NH_4F$ (s):35 ml $CH_3COOH$ and $HNO_3$ and 2 g $NH_4F$ (s):35 ml $CH_3COOH$ and $HNO_3$.

2. The method of claim 1 wherein said SEM sample is etched in said solution for a time of between about 1 second and 5 seconds.

3. The method of claim 1 wherein said low-K spin-on dielectric material comprises hydrogen silsesquioxane (HSG).

4. The method of claim 1 wherein said low-K spin-on dielectric material comprises methylsilsesquioxane (MSQ).

5. The method of claim 1 wherein said low-K spin-on dielectric material comprises hydrogen silsesquioxane (HSG).

6. The method of claim 1 wherein said low-K spin-on dielectric material comprises methylsilsesquioxane (MSQ).

7. A method for preparing SEM samples comprising low-K dielectric materials, comprising the steps of:
   a. providing a SEM sample comprising low-K dielectric material and silicon oxide material; and
   b. etching said SEM sample in a solution comprising $NH_4F$ (s) dissolved in a solution comprising $CH_3COOH$ having a concentration of between about 90% and 100% at a ratio of between about 0.5 g $NH_4F$ (s):20 ml $CH_3COOH$ and 2 g $NH_4F$ (s):20 ml $CH_3COOH$.

8. The method of claim 7 wherein said SEM sample is etched in said solution for a time of between about 1 second and 5 seconds.

9. The method of claim 7 wherein said low-K spin-on dielectric material comprises hydrogen silsesquioxane (HSG).

10. The method of claim 7 wherein said low-K spin-on dielectric material comprises methylsilsesquioxane (MSQ).

11. The method of claim 8 wherein said low-K spin-on dielectric material comprises hydrogen silsesquioxane (HSG).

12. The method of claim 8 wherein said low-K spin-on dielectric material comprises methylsilsesquioxane (MSQ).

* * * * *